(12) United States Patent
Reinmuth (10) Patent No.: US 8,481,401 B2
(45) Date of Patent: Jul. 9, 2013

(54) COMPONENT HAVING A THROUGH-CONTACT

(75) Inventor: Jochen Reinmuth, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 133 days.

(21) Appl. No.: 13/134,075

(22) Filed: May 26, 2011

(65) Prior Publication Data

US 2011/0298140 A1 Dec. 8, 2011

(30) Foreign Application Priority Data

Jun. 7, 2010 (DE) .................. 10 2010 029 760

(51) Int. Cl.
*H01L 21/311* (2006.01)
*H01L 21/44* (2006.01)
*H01L 21/461* (2006.01)
*H01L 21/4763* (2006.01)

(52) U.S. Cl.
USPC ........... 438/411; 438/619; 438/667; 438/701; 438/713; 438/719; 438/978; 257/E21.597; 257/E23.011

(58) Field of Classification Search
USPC ................. 438/411, 619, 667, 701, 713, 719, 438/978; 257/E21.597, E23.011
See application file for complete search history.

(56) References Cited

U.S. PATENT DOCUMENTS

| 5,618,752 | A * | 4/1997 | Gaul ............................. 438/626 |
| 7,544,531 | B1 * | 6/2009 | Grosjean ......................... 438/50 |
| 7,919,834 | B2 * | 4/2011 | Davis et al. ..................... 257/621 |
| 2005/0266687 | A1 * | 12/2005 | Morimoto ..................... 438/667 |
| 2007/0164419 | A1 * | 7/2007 | Sherrer et al. ................ 257/689 |
| 2007/0278619 | A1 * | 12/2007 | Clevenger et al. ............ 257/532 |
| 2008/0003817 | A1 * | 1/2008 | Morimoto ..................... 438/667 |
| 2009/0093117 | A1 * | 4/2009 | Taguchi et al. ............... 438/667 |
| 2009/0309230 | A1 * | 12/2009 | Cui et al. ..................... 257/773 |
| 2010/0133697 | A1 * | 6/2010 | Nilsson ........................ 257/774 |
| 2011/0207233 | A1 * | 8/2011 | Shimonaka .................. 436/501 |

* cited by examiner

*Primary Examiner* — Charles Garber
*Assistant Examiner* — Ron Pompey
(74) *Attorney, Agent, or Firm* — Kenyon & Kenyon LLP (57) ABSTRACT

A method for manufacturing a component having a through-contact includes: providing a substrate; forming an insulating layer on the substrate; structuring the insulating layer, the insulating layer being removed at least in a predetermined trenching area surrounding a selected substrate area; performing an etching process in which the structured insulating layer functions as a mask to remove substrate material in the trenching area and to create a trench structure surrounding the selected substrate area; and forming a metallic layer on the insulating layer, the metallic layer sealing the trench structure.

10 Claims, 9 Drawing Sheets

COMPONENT HAVING A THROUGH-CONTACT

BACKGROUND OF THE INVENTION

1. Field of the Invention

The present invention relates to a component having a through-contact and a method for manufacturing a component having a through-contact.

2. Description of the Related Art

Electrical contact structures, which extend through a substrate or a subarea of a substrate, are known in various embodiments. Such contact structures, also known as vias ("vertical interconnect access") or through-contacts, are becoming increasingly important because they facilitate the creation of space-saving components. A plurality of components may also be situated vertically one above the other and connected electrically by corresponding through-contacts, so that configurations having small (lateral) dimensions may be implemented.

Known methods for manufacturing a through-contact are based on insulating a substrate area of an electrically conductive substrate, which is to function as a "printed conductor," from the surrounding substrate material. For this purpose, a trench etching method ("trenching") is performed to create a trench structure, usually having a high aspect ratio, surrounding the substrate area. The corresponding substrate area is also suspended by insulating elements on a top side. On one hand, the trench structure should be sealed, and on the other hand, the smoothest possible surface should be provided. Sealing the trench structure helps to prevent unwanted or undefined introduction of material, which might have a deleterious effect on the insulation properties of the trench or the reliability of the through-contact. The smooth structure enables or facilitates performing the subsequent method steps, for example, CMOS (complementary metal oxide semiconductor) processes and MEMS (microelectromechanical system) processes.

In a known method, a trench structure is created, having a predefined, readily opening geometry which is subsequently filled with, for example, an oxide layer for insulation and a filling material, for example, polysilicon. A planarization process is performed next to smooth the surface. However, complete filling of the trench and performing the planarization process are relatively complex and difficult to control due to the predefined shape of the trench, which is adjusted relatively accurately.

Another known method includes producing a relatively narrow trench structure, which is sealed near the surface by depositing an oxide layer. According to one variant of the method, it is provided that, in order to create the sealing point as deep as possible, a first oxide is deposited first and is etched back anisotropically and then a second oxide is deposited. In addition, a planarization step may be provided to smooth the oxide seal. This method is associated with a relatively great effort, and it also cannot be used for some applications. On one hand, the effort increases drastically with an increase in width of the trench to be sealed, while on the other hand, a trench structure as narrow and, at the same time, as deep as desired cannot be produced.

BRIEF SUMMARY OF THE INVENTION

An object of the present invention is to provide an improved approach for manufacturing a component having a through-contact.

According to the present invention, a method for manufacturing a component having a through-contact is proposed. This method includes providing a substrate, forming an insulating layer on the substrate, and structuring the insulating layer, the insulating layer being removed at least in a predetermined trenching area surrounding a substrate area. This method also includes performing an etching process, in which the structured insulating layer is used for masking to remove substrate material in the trenching area and to create a trench structure surrounding the substrate area. In addition, the method includes forming a metallic layer on the insulating layer, thereby sealing the trench structure.

The method according to the present invention is relatively simple and robust and is characterized by relatively few steps. It is advantageous that the insulating layer is used both as an etching mask as part of the etching process and also for the purposes of insulation for the component. In addition, the trench structure is (hermetically) sealed with the aid of the metallic layer formed on the insulating layer instead of providing for the trench structure to be filled with insulation layers or filling layers as part of complex processes. Use of the metallic layer also makes it possible to achieve a relatively robust and mechanically stable sealing of the trench structure. The metallic layer may also be created to have a flat or planar surface, so that no additional planarization is necessary (with respect to any subsequent processes). The metallic layer may at the same time also be used as a rewiring plane or conductor plane. In addition, this method is compatible with known MEMS and CMOS processes (with respect to temperature and contamination). Formation of the through-contact does not require any high-temperature steps, so the method may also be used as a "via last process" in conjunction with temperature-sensitive preliminary processes.

In a preferred specific embodiment, the etching process is performed in such a way that the structured insulating layer is underetched and the trench structure has a widened shape in an upper area adjacent to the structured insulating layer. It is possible in this way to prevent, with a high reliability, the substrate area surrounded by the trench structure from being connected, i.e., short-circuited, to a section of substrate surrounding the trench structure, by material of the metallic layer possibly introduced into the trench structure when forming the metallic layer.

This is true similarly for another preferred specific embodiment in which the etching process is performed in such a way that the trench structure has a widened shape (also) in a lower area.

In another preferred specific embodiment, a part of the insulating layer is additionally removed in an opening area inside the trenching area during structuring. In addition, before performing the etching process, a protective layer covering the opening layer is formed, preventing removal of substrate material in the opening area. The protective layer is also removed after performing the etching process. This procedure makes it possible to establish a connection between the metallic layer (applied subsequently) and the substrate area surrounded by the trench structure.

In another preferred specific embodiment, the insulating layer in the trenching area is structured in the form of a grid. Reliable sealing of the trench structure may be achieved by the metallic layer in this way. This is possible even if the trench structure is designed to have a relatively large trench width and the metallic layer is designed to have a relatively small layer thickness.

In another preferred specific embodiment, forming the metallic layer includes forming multiple partial layers. This includes, for example, the use of different metals and/or forming partial layers having different arrangements and using different arrangement parameters. The metallic layer constructed from partial layers may be optimized for its particular functions in this way. For example, a first metal layer may be formed with regard to a low contact resistance; a subsequent layer may be formed for proper sealing of the trench structure and a last layer may be formed for good resistance to critical media which may reach the surface.

In this regard, it is also possible to provide for a portion of at least one of the plurality of partial layers to be removed before forming another of the plurality of partial layers. The removal may cause, for example, the layer thickness of a partial layer on a planar surface to be reduced to a greater extent than in an opening or, depending on the geometry, it may cause such a region to be further sealed. It is therefore possible to achieve the result that with a very small average thickness of the metallic layer, there is an increased layer thickness in the sealing area on the trench structure.

In another preferred specific embodiment, the substrate is provided with an etch-stop layer on one side. The etch-stop layer offers the option of terminating the etching process on reaching the etch-stop layer.

In addition, a component having a substrate and a through-contact in the substrate is additionally proposed according to the present invention. The through-contact includes a substrate area and a trench structure surrounding the substrate area. The component also has a structured insulating layer, which is situated on the substrate and is removed at least in the area of the trench structure. In addition, the component has a metallic layer, which is situated on the insulating layer and seals the trench structure. Such a component may be manufactured relatively easily and inexpensively. This component is also characterized by mechanically stable sealing of the trench structure.

DETAILED DESCRIPTION OF THE INVENTION

Specific embodiments of a method for manufacturing a component having a through-contact are described on the basis of the following figures; this component is relatively simple and robust and requires only a relatively few steps to be performed. Conventional processes (for example, CMOS and MEMS processes) and materials in semiconductor and microsystems technology may be used in this manufacturing method, so that these need only be described briefly here. Furthermore, it is pointed out that in addition to the method steps and processes described here, other method steps may also be performed to complete the manufacture of the components shown.

FIGS. 1 through 5 show a method for manufacturing a component 111 having a through-contact, each shown in a schematic lateral sectional diagram. Method steps performed in this method are also summarized in the flow chart in FIG. 6. Manufactured component 111 is an integrated circuit or a semiconductor chip, for example. Possible examples of this include an application-specific integrated circuit (ASIC), a memory component and a processor or microprocessor.

Figure 4:
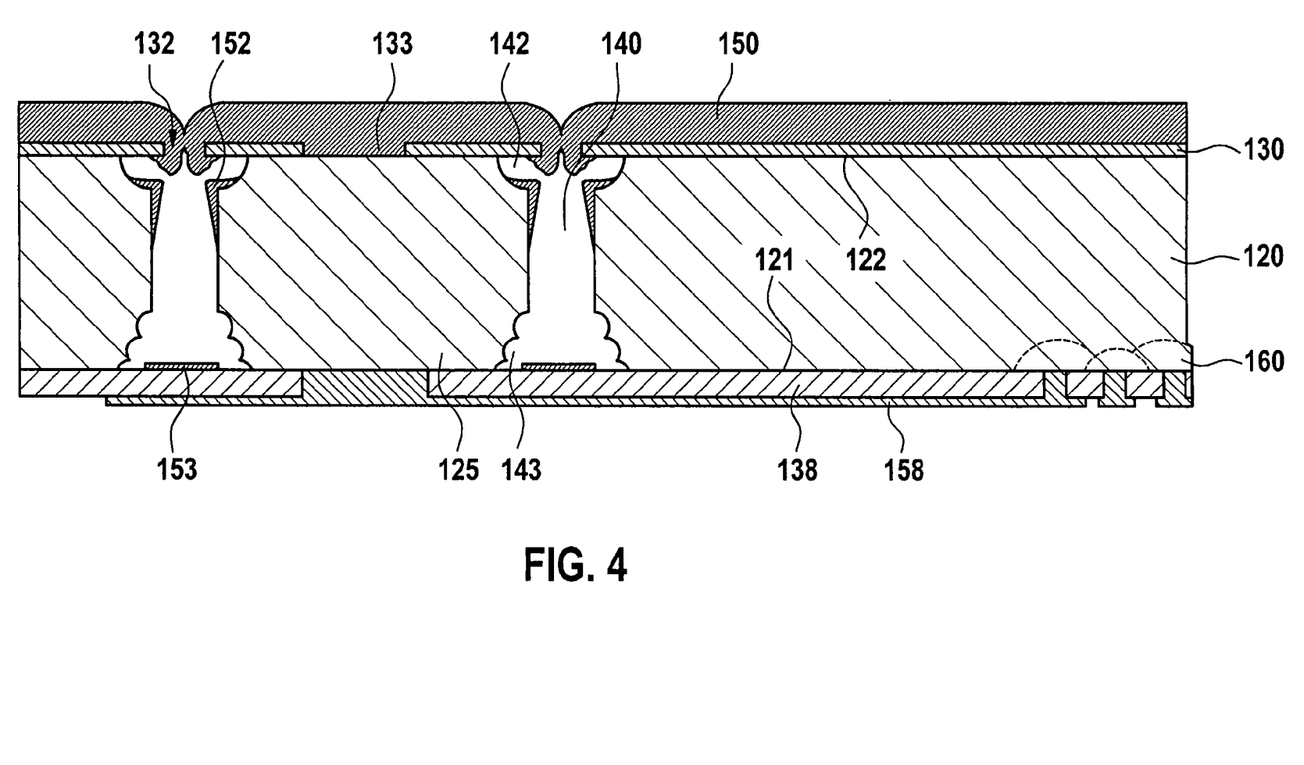
Figure 5:
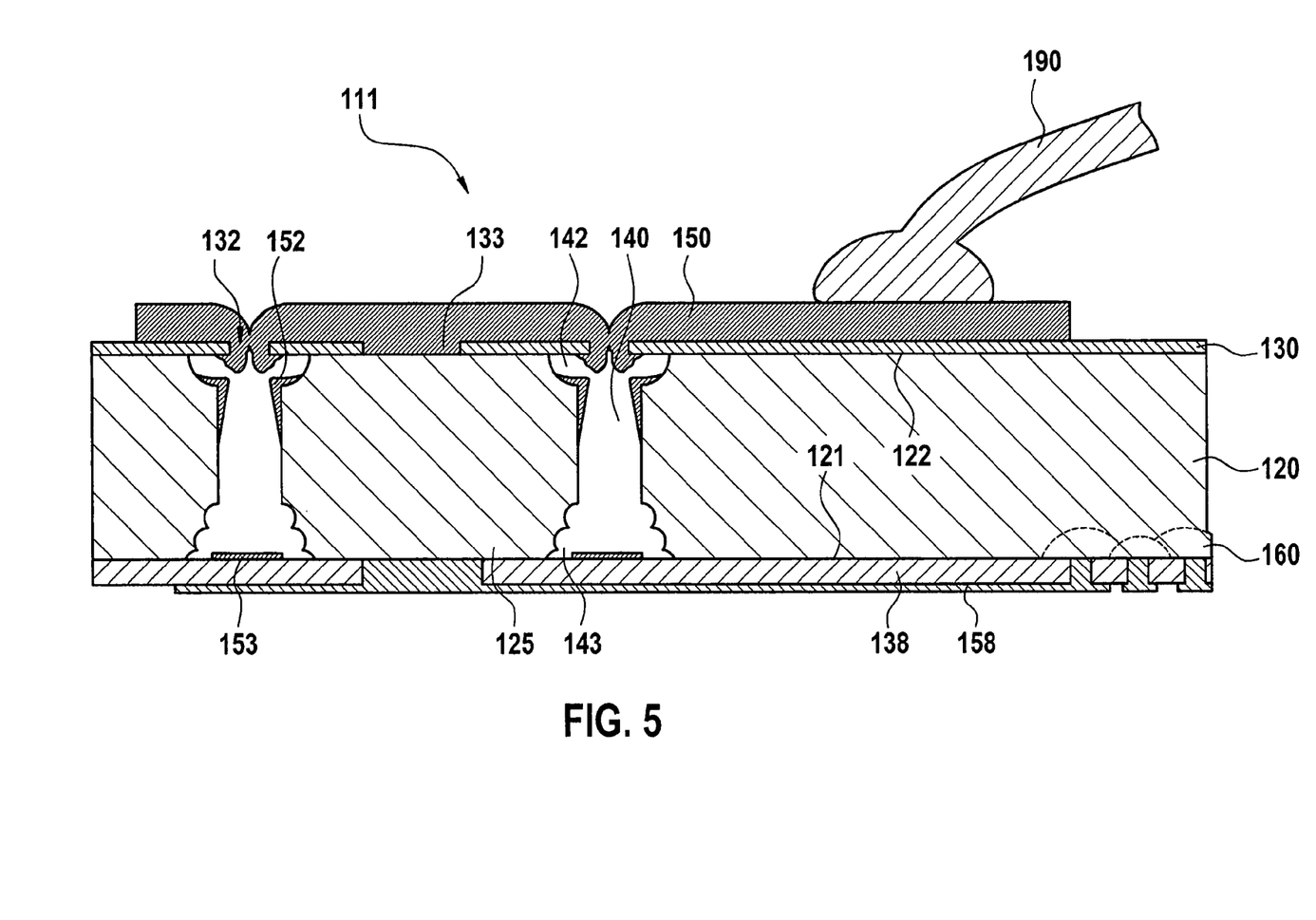
Figure 6:
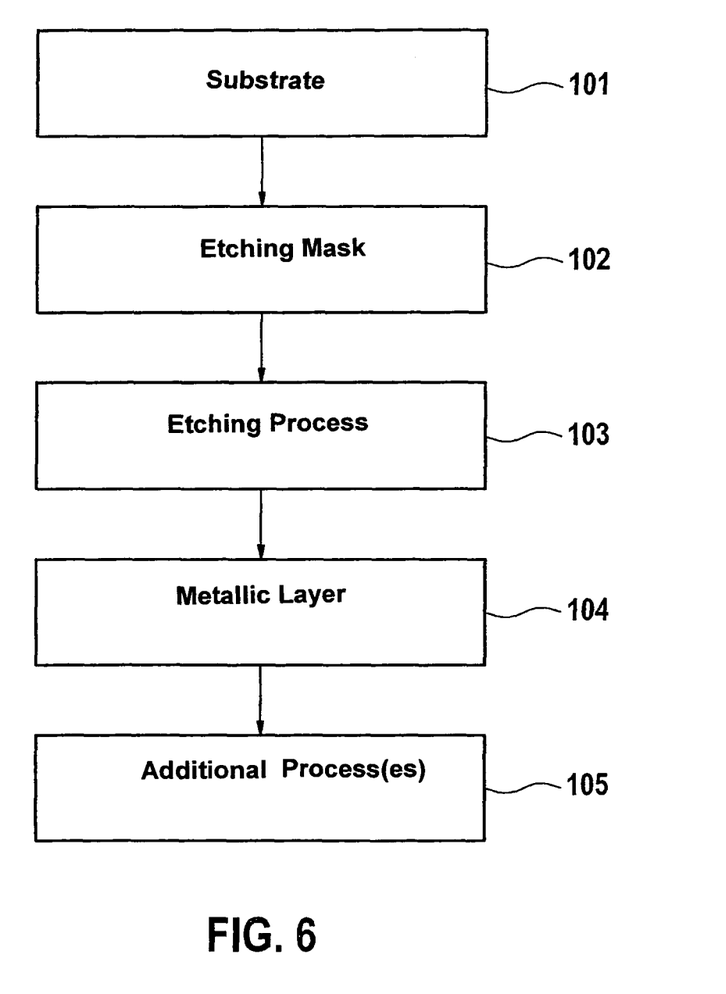
FIG. 6 shows a flow chart of a method for manufacturing a component having a through-contact.

At the start of the method, a substrate 120, only sections of which are illustrated in FIGS. 1 through 5, is supplied in a step 101 (cf. FIG. 6). Substrate 120 is a silicon wafer, for example, doped essentially totally or at least in a partial area (of the subsequent through-contact) to provide electrical conductivity.

Figure 1:
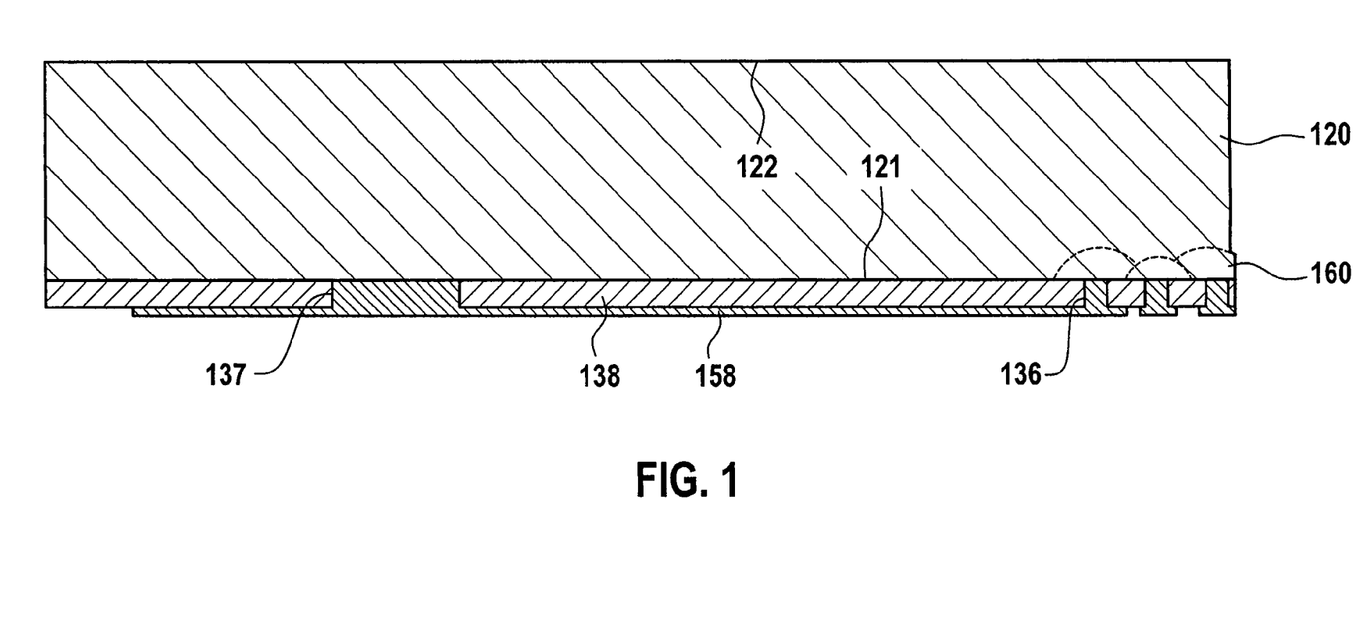
FIGS. 1 through 5 show schematic lateral sectional diagrams illustrating the manufacture of a component having a through-contact.

Supplied substrate 120 also has additional structures or layers, as shown in FIG. 1, which may be created as part of conventional processes on one side 121, hereinafter also referred to as bottom 121. These include, for example, a transistor 160 implemented in substrate 120, its differently conductive and doped regions being indicated by dashed lines. In addition, a configuration of a structured insulating layer 138 and a structured electrically conductive layer 158 is formed on bottom 121. Layer 158 having a metal or (doped) polysilicon, for example, functions as the conductor and as the contact structure for transistor 160 and its doped regions. Insulating layer 138, which is a silicon oxide layer, for example, has openings 136 in the area of transistor 160 as well as an opening 137 in the area of the subsequent through-contact. At these locations, layer 158 situated on insulating layer 138 outside of openings 136, 137 is in direct contact with (original) substrate 120 or its side 121, thereby enabling an electrical connection between transistor 160 and substrate area 125 of the subsequent through-contact.

Figure 2:
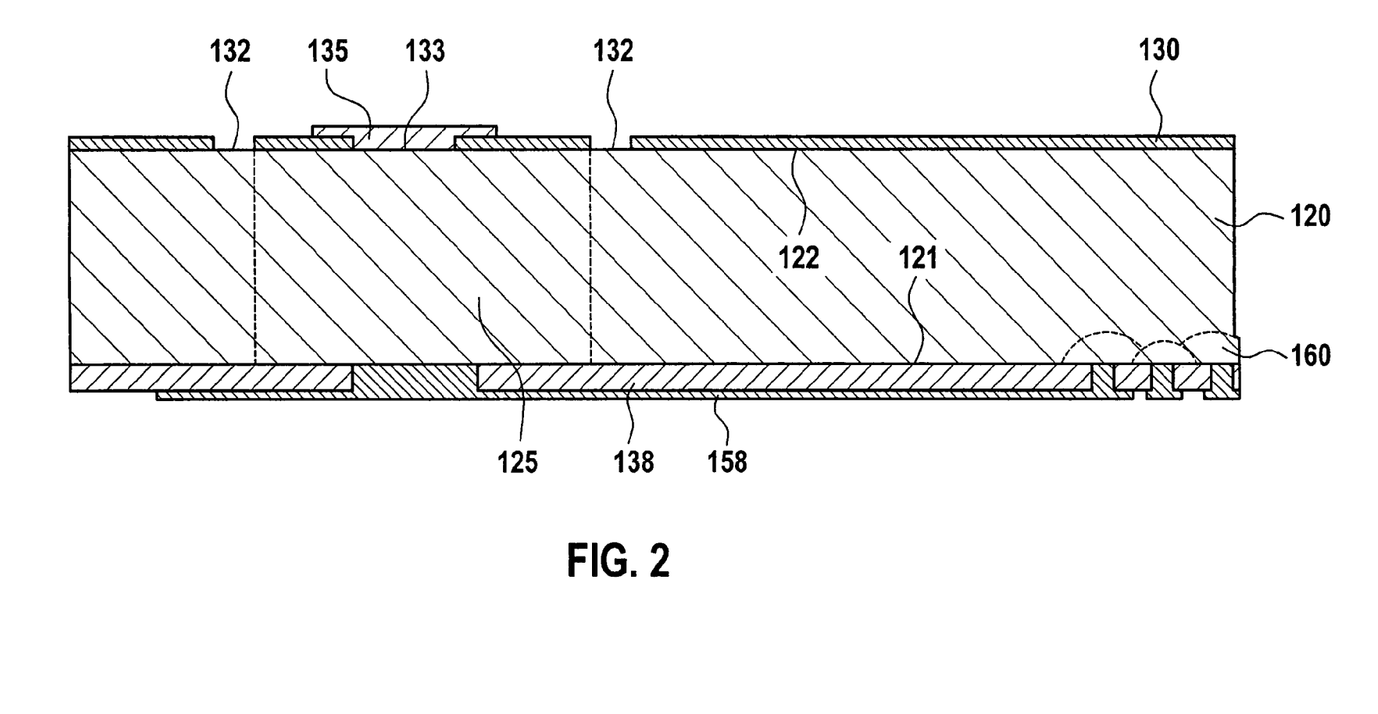

In another step 102 (cf. FIG. 6), a hard mask or etching mask is formed on a side 122 of substrate 120, hereinafter referred to as top 122, which is opposite to bottom 121, as shown in FIG. 2. For this purpose, an insulating or dielectric layer 130 containing silicon oxide, for example, is formed on top 122 of substrate 120. This may be accomplished by applying layer 130 to substrate 120 over a large area, for example, by performing a CVD method (chemical vapor deposition). The so-called TEOS method using tetraethyl orthosilicate (TEOS) as the starting material may be considered, for example. Alternatively, layer 130 may be formed by growing a thermal oxide on substrate side 122.

Insulating layer 130 is also structured so that insulating layer 130 is removed, i.e., opened, in one predetermined area 132 and in another predetermined area 133, as shown in FIG. 2, and substrate 120 is exposed in these locations. A conventional photolithographic structuring and etching method may be used for structuring insulating layer 130. Area 132, by which the lateral shape of a trench created as part of a subsequent etching process is predetermined and which is therefore also referred to hereinafter as trenching area 132, has a closed shape surrounding a substrate area 125 (as seen from above) in the form of a rectangle or a circular ring, for example (not shown). Enclosed substrate area 125 is indicated in FIG. 2 by dashed lines. Opening area 133, also referred to as "stamp area" 133, which establishes electrical contact with substrate 120 (later), is also surrounded by trenching area 132 or situated inside of trenching area 132.

After structuring of insulating layer 130, an additional protective layer 135 is formed on substrate 120 and on insulating layer 130 within trenching area 132, so that opening area 133 and (previously) exposed substrate 120 are covered again in this location, as shown in FIG. 2.

Protective layer 135 prevents an etching attack of substrate 120 through or in open area 133. A photoresist, for example, may be considered as the material for protective layer 135. The etching mask is complete after forming protective layer 135.

Figure 3:
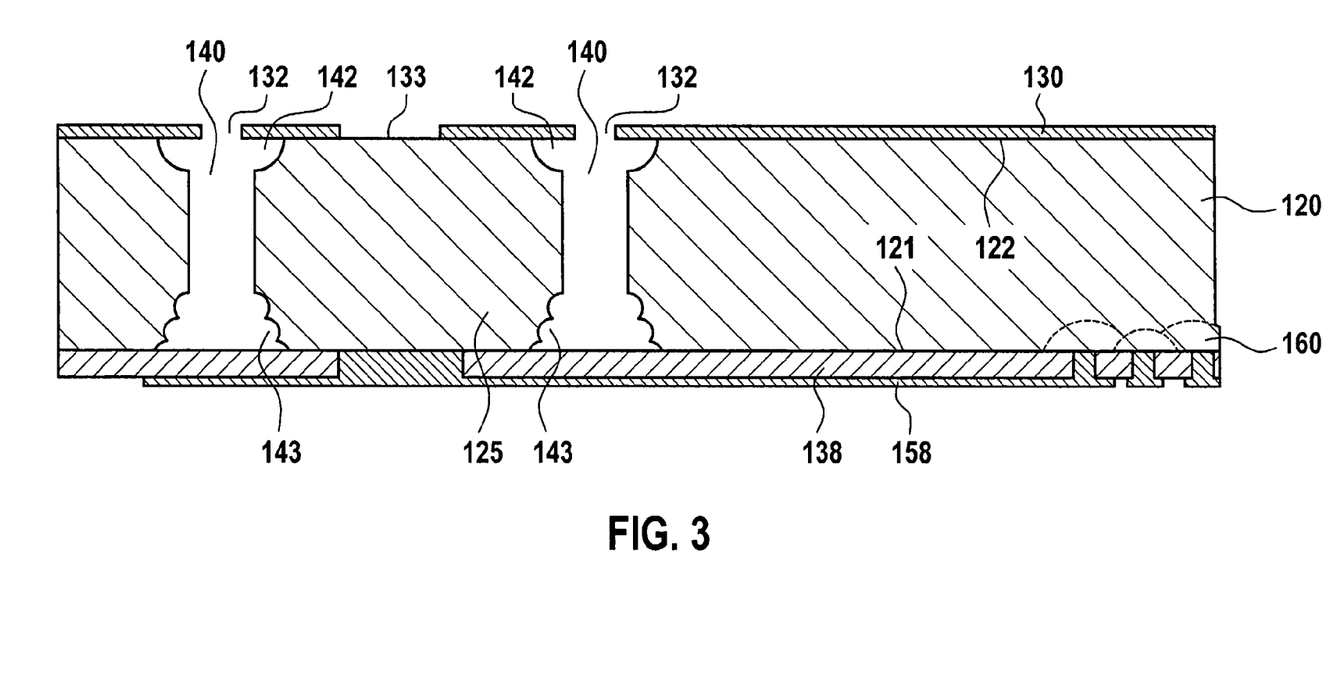

Next a trenching process is performed in a step 103 (cf. FIG. 6), in which structured insulating layer 130, partially covered by protective layer 135, is used to mask substrate 120. A deep reactive ion etching (DRIE) process may be used as the trenching process, for example. One possible example is the so-called Bosch process, in which an etching step and a passivation step are repeated successively. In the trenching process, the substrate material in trenching area 132 is removed, creating a trench structure 140 surrounding substrate area 125, as shown in FIG. 3. Substrate area 125 and trench structure 140 together form the conductive and insulating components of a through-contact. Substrate area 125, also referred to below as through-contact area 125, is insulated by trench structure 140 with respect to the surrounding material of substrate 120. The trenching process is performed to reach insulating layer 138 on bottom 121 of substrate 120, which (like insulating layer 130 and protective layer 135 on top 122 of substrate 120) is attacked very little or not at all in the etching process and therefore may function in the sense of an "etch-stop layer."

The trenching process is preferably performed in such a way that the insulating trenches and trench structure 140 have a relatively high aspect ratio, i.e., the trench width is much smaller than the trench height or trench depth. This makes it possible to achieve the result that trench structure 140 takes up only a relatively small area on substrate 120 or on its sides 121, 122.

In addition, it is provided that the trenching process is to be performed in such a way that insulating layer 130 on top 122 of substrate 120 is underetched and trench structure 140 has a widening shape, i.e., it becomes broader, at this location in the direction of top 122. For illustration, FIG. 3 shows a widened trench area 142 in the form of a groove, for example. In addition, it is provided that the trenching process is to be performed in such a way that trench structure 140 also has a widening shape, i.e., it opens in the direction of bottom 121, as illustrated in FIG. 3 on the basis of a widened trench area 143 having a plurality of grooves, for example. Alternatively, trench area 143 may also be in the form of a single groove. Between trench areas 142, 143, the trench structure has a "straight" section having mutually perpendicular or parallel trench walls. Widened trench areas 142, 143 of trench structure 140, with the aid of which the insulating properties of trench structure 140 are reliably ensured, as described further below, may be created by a corresponding choice and/or adjustment of etching parameters used in the etching process.

As part of step 103 (cf. FIG. 6), protective layer 135 is subsequently removed after forming trench structure 140, as shown in FIG. 3, so that substrate 120 is exposed (again) in opening area 133. This removal may be accomplished by using, for example, acetone or some other solvent in the case of a protective layer 135 having a photoresist material.

In a subsequent step 104 (cf. FIG. 6), a metallic layer 150 is applied to substrate 120 or to insulating layer 130 over a large area, as illustrated in FIG. 4. Metallic layer 150 is also formed in the area of trenching area 132 (used for etching trench structure 140) in particular, so that trench structure 140 is hermetically sealed. Metallic layer 150 is also applied directly to substrate 120 in opening area 133, permitting electrical contact between metallic layer 150 and through-contact area 125. Metallic materials which may be considered for layer 150 include aluminum, nickel or titanium, for example. Various metals as described in greater detail below are also possible. A layer may also be deposited within trench structure 140, as illustrated in FIG. 4 on the basis of additional metallic layers 152, 153.

Possible processes for forming metallic layer 150 include directional deposition methods in particular, for example, a sputtering method or a vapor deposition method. A directional deposition method offers the option of (mostly) suppressing deposition of a layer at the edge or on a trench wall of trench structure 140 and consequently preventing the possibility of an electrical connection between through-contact area 125 and substrate 120 surrounding trench structure 140 (over the deposited metal), which could impair or cancel the insulating property of trench structure 140.

However, such an unwanted connection due to underetching of insulating layer 130 may also be prevented in the case of a relatively nondirectional deposition of metal or deposition at the upper trench edge, as indicated in FIG. 4 on the basis of metallic layer 152. Due to trench area 142, which is widened at this point, of trench structure 140, metallic layer 152 in trench structure 140 and metallic layer 150 at the surface or in sections of metallic layer 150, which, as shown in FIG. 4, protrude, if necessary, somewhat into trench structure 140 at trenching area 132 and "encompass" insulating layer 130, are reliably separated from one another by a sufficient distance.

With regard to an optional layer deposition on insulating layer 138, which is indicated on the basis of metallic layer 153 in FIG. 4, an electrical connection between through-contact area 125 and the substrate section surrounding trench structure 140 may be reliably prevented by trench area 143, which is widened at this location.

Forming metallic layer 150 offers the option of sealing trench structure 140 in a relatively simple manner instead of filling trench structure 140 with a filling material in a complex operation. Relatively robust and mechanically stable sealing of trench structure 140 may also be implemented with the aid of metallic layer 150. Furthermore, metallic layer 150 may also be applied to substrate 120 or to insulating layer 130 in such a way that metallic layer 150 (outside of trenching area 132) has a relatively flat or planar surface. With regard to any subsequent operations presupposing the existence of a planar surface, any complex planarization operation may therefore be omitted.

Following application of metallic layer 150 and spanning of trench structure 140 using layer 150, additional processes may be performed to complete component 111. These processes, which are summarized in a step 105 in the flow chart in FIG. 6, include structuring of metallic layer 150 in particular, as illustrated in FIG. 5 on the basis of component 111. A conventional photolithographic structuring and etching method may be used for structuring metallic layer 150. Metallic layer 150 may also be used in this way as a rewiring plane or conductor plane in addition to sealing trench structure 140.

In this context, transistor 160 may be contacted on bottom 121 of substrate 120 via metallic layer 150 in the area of top 122 of the substrate, because metallic layer 150 is connected via opening area 133 to through-contact area 125, which is also adjacent to conductive layer 158 connected to transistor 160. Insulating layer 130, which functions as an etching mask in the trenching process, is used here (like insulating layer 138) to insulate the "conduction path" with respect to substrate 120 outside of trench structure 140.

Furthermore, additional processes may be performed within the scope of step 105 to form additional structures and/or layers or function layers on substrate 120 or on (structured) metallic layer 150 (not shown), for example. Furthermore, the option of performing a separation operation to separate component 111 may also be considered. Component 111 may also be accommodated in a housing and contacted and/or placed in or connected to a system having one or more additional components, so that electrical contacting of component 111 is accomplished with the aid of wire bond connections, for example. To illustrate such a type of contact, FIG. 5 shows a portion of bond wire 190 connected to metallic layer 150.

In addition to the advantages mentioned above, another advantage of this method is that all the processes for forming the through-contact, forming insulating layer 130 and metallic layer 150 in particular, may be performed without a high-temperature step, i.e., at temperatures in a range above approximately 500° C., for example. Steps 102 through 105 of the method illustrated in FIG. 6 may in this way also be used as the "via last process" in conjunction with temperature-sensitive preliminary processes.

With regard to the method of FIG. 6, there is the option of performing some of the steps and/or processes described here in some other way and/or of varying them. Possible modifications which may be considered and may also be combined with one another are described in greater detail below. It is pointed out here that reference is made to the preceding discussions with regard to the details already described, which refer to similar or corresponding components, method steps possibly used, potential advantages, etc.

It is possible, for example, to form a plurality of different partial layers one after the other on substrate 120 or on insulating layer 130 to form metallic layer 150 in step 104, and again sputtering or vapor deposition methods may be used (not shown). The partial layers may contain different metals, for example. It is also possible for some or all of the partial layers to contain the same metal, although the metal has been deposited in different ways, for example, in different arrangements and using different arrangement parameters. It is possible in this way to optimize metallic layer 150 composed of multiple layers with regard to different properties and functions. For example, metallic layer 150 may be formed from three metal layers, the first (lower) metal layer allowing a low contact resistance with substrate area 125, the second (middle) metal layer allowing a mechanically stable sealing of trench structure 140 and the third (upper) metal layer allowing a high resistance with respect to critical media with which the surface might come in contact.

It may also prove advantageous to deposit metallic layer 150 in multiple steps or to form it in the form of multiple partial layers and to remove a portion of layer 150 (or at least a partial layer) in between, for example, by performing a sputter etching process ("resputtering"). Through such a procedure, it is possible to reduce the layer thickness of metallic layer 150 (or a partial layer) to a greater extent on a planar surface than in an opening, i.e., in particular in the area of trenching area 132, or to seal such an area further depending on the geometry. It is possible in this way to achieve the result that for a relatively small thickness of metallic layer 150 on the average, an increased layer thickness is produced in the area of trenching area 132.

Figure 7:
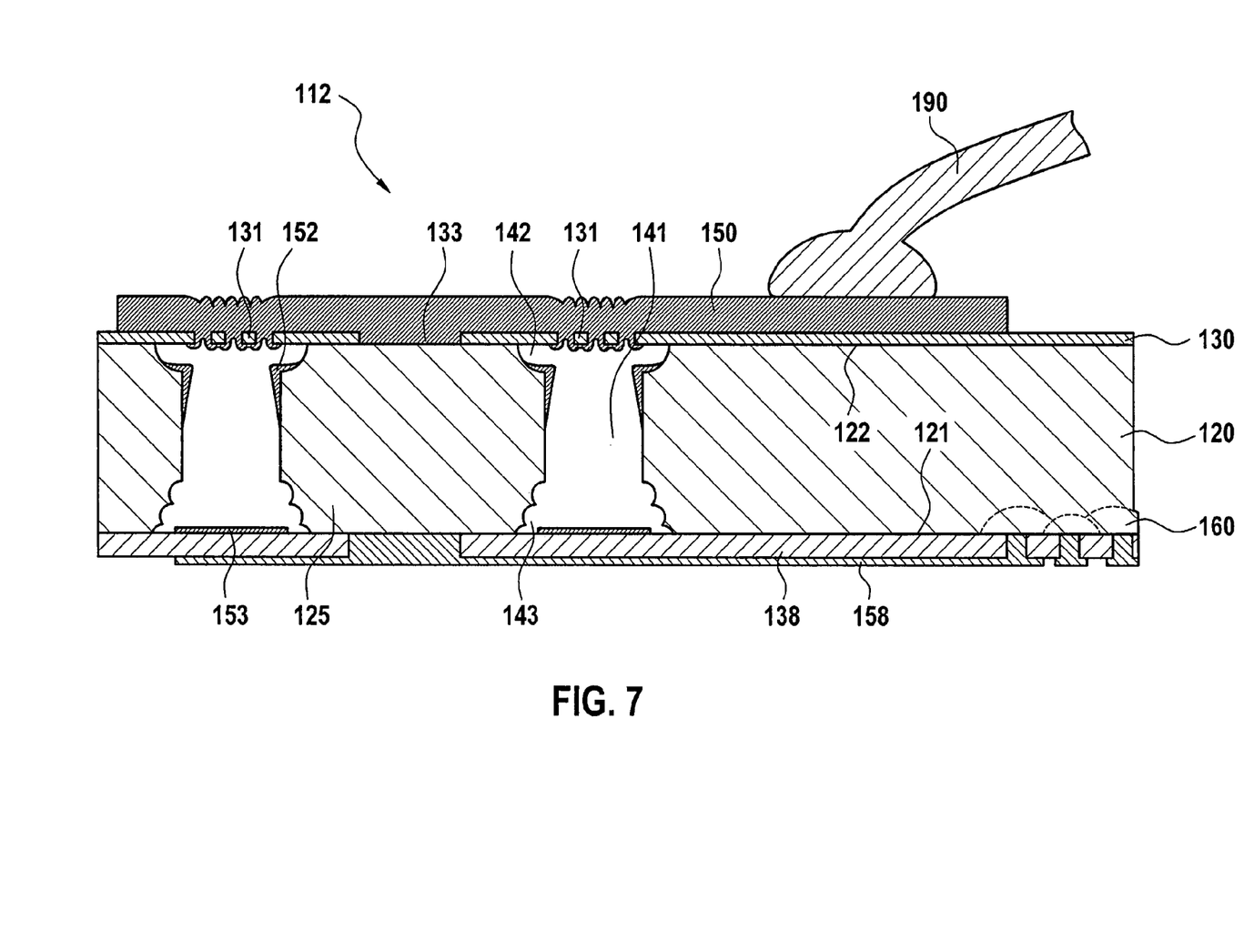
FIGS. 7 through 9 show schematic lateral sectional diagrams illustrating additional components having a through-contact.

Another possible alternative refers to component 112 shown (partially) in FIG. 7. In manufacturing component 112, no continuous or closed trenching area 132 (as seen from above) is formed in structuring insulating layer 130 as part of step 102 but instead a grid-type trenching area 131 having relatively narrow webs is formed, grid-shaped trenching area 131 as well as continuous trenching area 132 (as seen from above) surrounding a substrate area 125 and being used for etching a trench structure 141 (step 103). Webs of the grid are completely underetched in trenching. The grid-type layout of trenching area 131 results in metallic layer 150 no longer sealing essentially the entire width of the trench in step 104 but instead in sealing only individual "honeycombs" of the grid. It is therefore possible to achieve the result that even a trench structure 141 having relatively wide trenches is reliably sealed by metallic layer 150 even if metallic layer 150 is formed with a relatively small thickness.

The method of FIG. 6 is not limited to manufacturing only components 111, 112 or the integrated circuits shown in FIGS. 5 and 7 but instead may also be used to manufacture other components. Micromechanical components may be considered here in particular.

Figure 8:
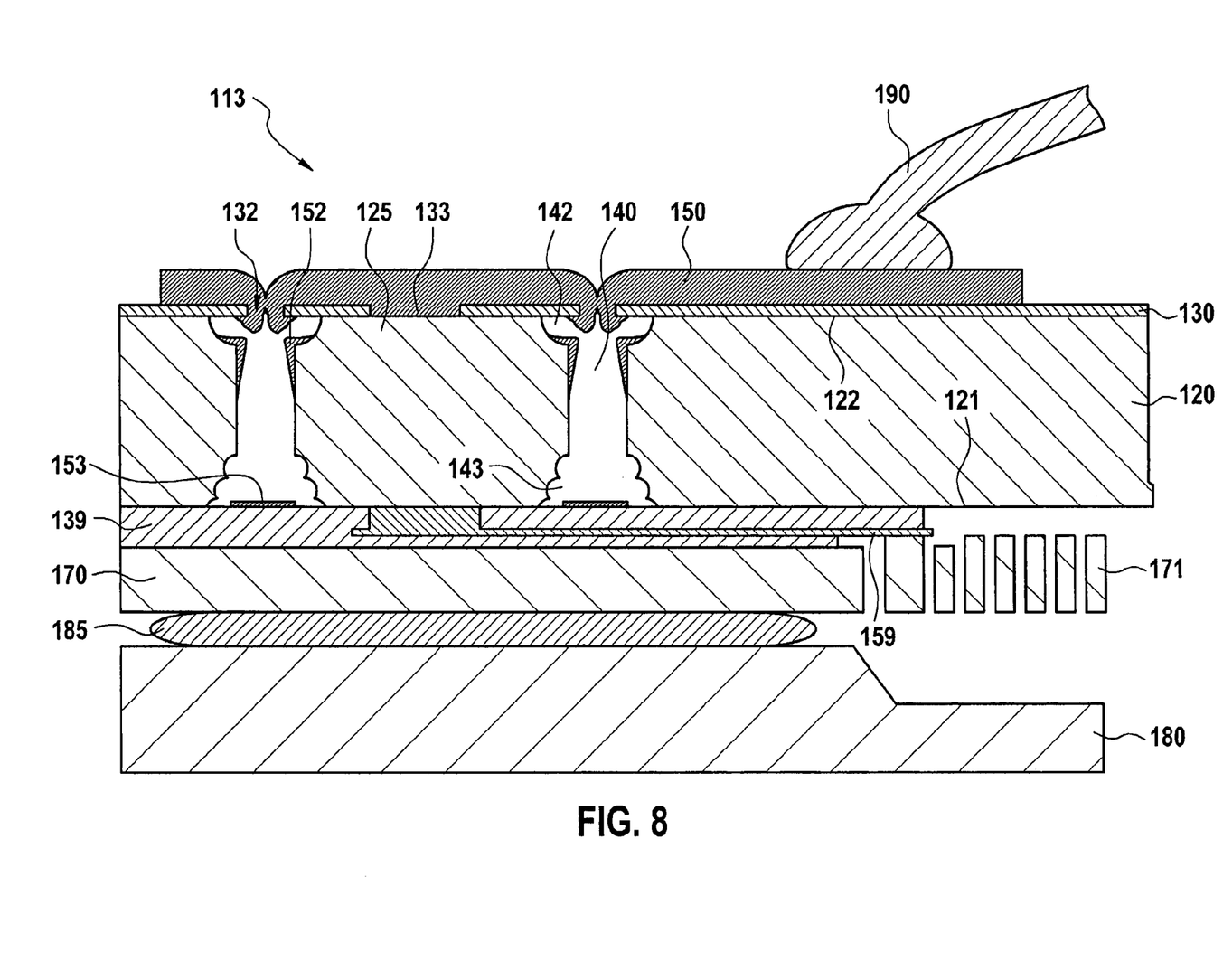

To illustrate this, FIG. 8 shows as an example a detail of such a micromechanical component 113, which is used in an acceleration sensor or in a yaw rate sensor, for example. Component 113 again has substrate 120 having through-contacting, i.e., through-contact area 125 and trench structure 140 as well as layers 130, 150 in the area of top 122 of the substrate.

A configuration of an insulating layer 139 having a conductive layer 159 embedded partially therein is provided on bottom 121 of substrate 120. The insulating layer is a silicon oxide layer, for example. Conductive layer 159, which is a (doped) polysilicon layer, for example, and functions as a conductor or contact structure is directly connected to through-contact area 125 via an opening in insulating layer 139. A conductive function layer 170 is provided adjacent to insulating layer 139. Function layer 170 is a so-called epi-polysilicon layer, for example, i.e., a polycrystalline silicon layer, which is created in an epitaxial process and may optionally be doped. Function layer 170 is designed in the form of an exposed micromechanical structure 171 (microstructure or MEMS structure) having mobile function elements in a partial area. Micromechanical structure 171 or a part thereof is contacted here at an edge of conductive layer 159. In addition, another substrate 180 is connected to function layer 170 by a connecting layer 185. Additional substrate 180 containing silicon, for example, is a cap structure or a cap wafer, with the aid of which micromechanical structure 171 is hermetically sealed.

With regard to manufacturing of through-contact in the case of component 113 according to the method of FIG. 6, there is the option, for example, of initially providing substrate 120 with a configuration of layers 139, 159, 170 in step 101, when micromechanical structure 171 has not yet been formed or exposed. Following this, steps 102, 103, 104 described above may be performed, with insulating layer 139 optionally functioning as an etch-stop layer in the etching process (step 103). As part of following step 105, metallic layer 150 may be structured, micromechanical structure 171 may be formed by performing corresponding MEMS processes, function layer 170 may be connected to substrate 180 via connecting layer 185, and a bond wire 190 may be connected to metallic layer 150, as indicated in FIG. 8. Bond wire 190 is electrically connected to micromechanical structure 171 via metallic layer 150, through-contact area 125 and conductive layer 159 for applying a predetermined electrical potential to micromechanical structure 171 during operation of component 113, for example. Instead of the process sequence mentioned above as an example, the processes may also be performed in another order. For example, before performing steps 102, 103, 104, substrate 120 may be provided with micromechanical structure 171, which has been formed, and if necessary with substrate 180, which is connected to function layer 170 in step 101.

Figure 9:
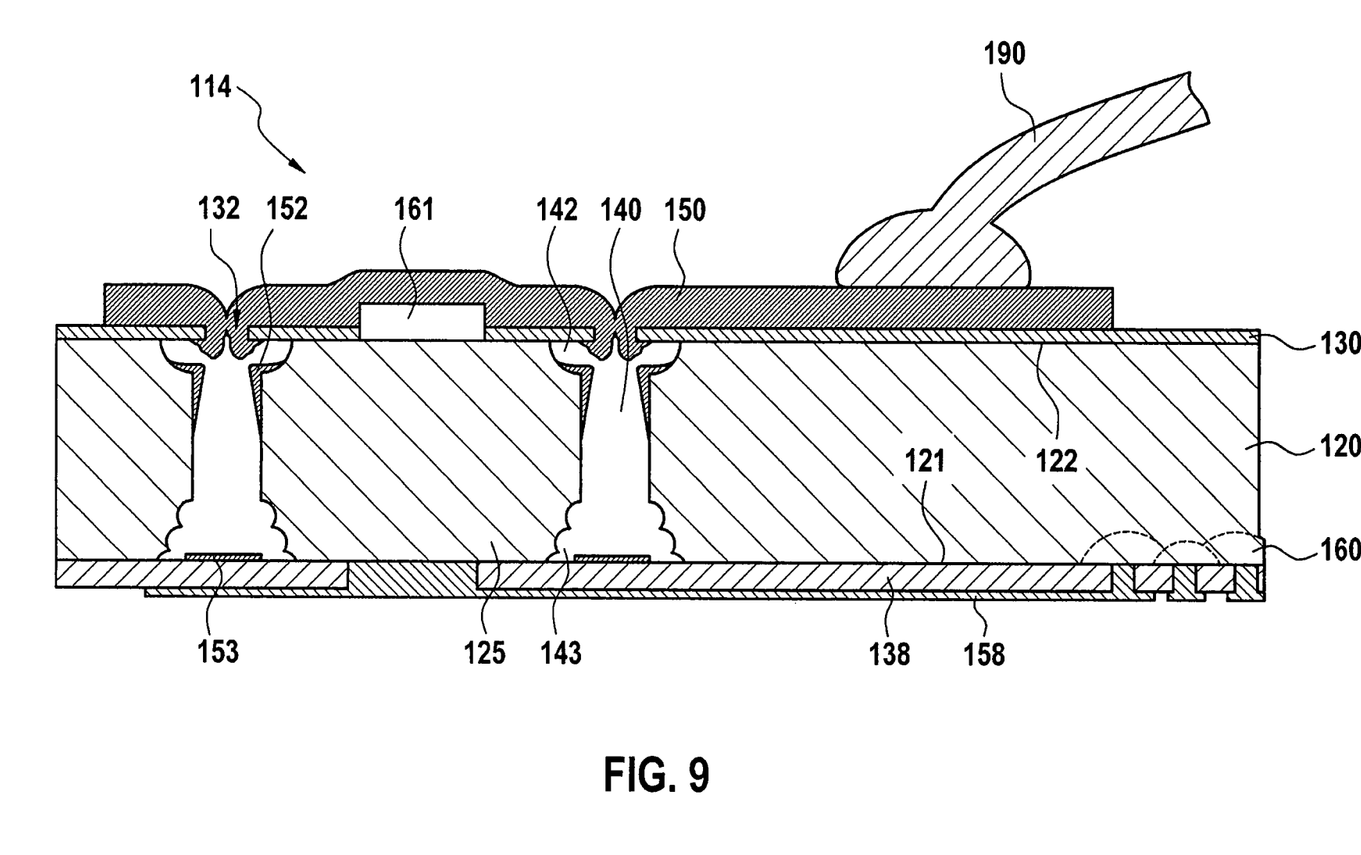

Another possible modification of the manufacturing method relates to component 114, which is shown (partially) in FIG. 9 and has essentially the same structure as component 111 in FIG. 5. In contrast with component 111, component 114 has another element 161 in or on top 122 of substrate 120, contacting through-contact area 125. Element 161 may be, for example, another circuit element or a metallic surface or a metal sheet. Additional element 161 contains a metal or another material, which is not (or almost not) attacked in the etching process to form trench structure 140 (step 103). Element 161 may also be surrounded by such a material. In such an embodiment, the formation and removal of a protective layer 135 as described above may be omitted.

The specific embodiments explained on the basis of the figures represent preferred or exemplary specific embodiments of the present invention. Instead of the specific embodiments described here, additional specific embodiments, which may include additional modifications or combinations of described features, are also conceivable.

With regard to the materials mentioned, there is the option of replacing them with other materials, for example. Other substrates having a different structure or other structures may also be provided and/or used with a semiconductor material other than silicon, in which a through-contact is formed using the approaches described above. Furthermore, additional processes beyond those described here and/or other elements and structures may also be formed.

With regard to component 114 of FIG. 9, there is, for example, the option of providing a plurality of elements contacting substrate area 125 instead of individual element 161. A "buried" element in which a partial area or a side lies in the same plane as top 122 of substrate 120 is also possible. Additional elements contacting substrate area 125 may also be provided in or on the area of bottom 121 of substrate 120. Such embodiments having one or more additional elements on top 122 and/or bottom 121 of substrate 120, contacting or adjacent to through-contact area 125, may also be considered with the other components 111, 112, 113 of FIGS. 5, 7 and 8.

In addition, it is pointed out that this method is not limited to manufacturing a single through-contact in a substrate. A plurality of through-contacts may be formed in a substrate by this method, which may be implemented essentially simultaneously or in parallel in particular.

There is also the option of performing the processes described here in another sequence or in the same manner, if necessary. One possible example is to form insulating layers 130, 138 of component 111 of FIG. 5. Instead of forming layers 130, 138 separately from one another on topside and bottom side 121, 122 of substrate 120, both layers 130, 138 may also be created by thermal growth, for example, in a joint process on substrate 120.

In addition, it is pointed out that instead of trench structures 140, 141 shown here, trench structures having a different layout or a different geometry may also be created. One example is a trenched structure having a widened shape only in an upper area. Such a geometry may be selected for the case when there is negligible deposition of metallic material or none at all in a lower area of the trench structure in forming a metallic layer to seal the trench structure.

What is claimed is:

1. A method for manufacturing a component having a through-contact, comprising:
   providing a substrate;
   forming an insulating layer on the substrate;
   structuring the insulating layer by removing the insulating layer at least in a predetermined trenching area surrounding a selected substrate area;
   performing an etching process as follows:
      trenching the structured insulating layer functioning as a mask in the etching process, and
      creating a trench structure in the substrate surrounding the selected substrate area having a widening shape at opposite surface edges of the substrate exceeding a trenched area of the structured insulating layer; and
   forming a metallic layer on the insulating layer, wherein the metallic layer seals the trench structure and wherein a parameter of the widening shape of trench structure is selected during the etching process such that an excess metallic compound falling through the undertrenched structured insulating layer and onto a wall of the trench structure during the forming of the metallic layer does not form an electrical connection between the metallic layer and the wall of the trench structure.

2. The method as recited in claim 1, wherein the etching process is performed in such a way that the structured insulating layer is underetched and the trench structure has a widened shape in an upper area adjacent to the structured insulating layer.

3. The method as recited in claim 2, wherein the etching process is performed in such a way that the trench structure additionally has a widened shape in a lower area, and wherein a middle area of the trench structure is narrower than the upper and lower areas.

4. The method as recited in claim 3, wherein a portion of the insulating layer is additionally removed in an opening area within the trenching area in structuring the insulating layer, and wherein a protective layer covering the opening area is formed before performing the etching process, the protective layer preventing removal of substrate material in the opening area during the etching process, and wherein the protective layer is removed after performing the etching process.

5. The method as recited in claim 4, wherein the insulating layer is structured in the form of a grid in the trenching area.

6. The method as recited in claim 4, wherein the forming of the metallic layer includes forming a plurality of partial layers.

7. The method as recited in claim 6, wherein a part of at least one of the plurality of partial layers is removed before forming an additional one of the plurality of partial layers.

8. The method as recited in claim 4, wherein the substrate is provided with an etch-stop layer on one side and the etching process is terminated on reaching the etch-stop layer.

9. A component, comprising:
   a substrate;
   a through-contact in the substrate, the through-contact including a selected substrate area and a trench structure surrounding the selected substrate area having a widening shape at opposite surface edges of the substrate;
   a structured insulating layer situated on the substrate having an area smaller than that of a trenched area in the trench structure removed at least in the area of the trench structure; and
   a metallic layer situated on the insulating layer, the metallic layer sealing the trench structure, wherein a width of the widening shape of trench structure is selected such that an excess metallic compound from the metallic layer falling through the removed area of the structured insulating layer and onto a wall of the trench structure does not form an electrical connection between the metallic layer and the wall of the trench structure.

10. The component as recited in claim 9, wherein the trench structure has a widened shape in an upper area adjacent to the structured insulating layer and also in a lower area, and wherein a middle area of the trench structure is narrower than the upper and lower areas.

* * * * *